(12) United States Patent
Hiroshiro et al.

(10) Patent No.: US 11,723,259 B2
(45) Date of Patent: Aug. 8, 2023

(54) SUBSTRATE PROCESSING APPARATUS AND METHOD OF PROCESSING SUBSTRATE

(71) Applicant: Tokyo Electron Limited, Tokyo (JP)

(72) Inventors: Koukichi Hiroshiro, Koshi (JP); Jun Nonaka, Koshi (JP); Kazuya Koyama, Koshi (JP); Mitsunori Nakamori, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 83 days.

(21) Appl. No.: 17/336,657

(22) Filed: Jun. 2, 2021

(65) Prior Publication Data

US 2021/0391539 A1 Dec. 16, 2021

(30) Foreign Application Priority Data

Jun. 10, 2020 (JP) ................................ 2020-100983

(51) Int. Cl.
*H10K 71/15* (2023.01)
*H10K 77/10* (2023.01)
*H10K 85/10* (2023.01)

(52) U.S. Cl.
CPC ............. *H10K 71/15* (2023.02); *H10K 77/10* (2023.02); *H10K 85/10* (2023.02)

(58) Field of Classification Search
CPC ............. H01L 51/0007; H01L 51/0034; H01L 51/0096; H10K 71/15; H10K 77/10; H10K 85/10
USPC ........................................................ 257/40
See application file for complete search history.

(56) References Cited

U.S. PATENT DOCUMENTS

2016/0089696 A1* 3/2016 Kimura ................... C03C 17/30
427/299
2019/0341246 A1* 11/2019 Okumura .......... H01L 21/02057

FOREIGN PATENT DOCUMENTS

JP         2014-103149 A       6/2014

* cited by examiner

*Primary Examiner* — Quoc D Hoang
(74) *Attorney, Agent, or Firm* — Armstrong Teasdale LLP

(57) ABSTRACT

A method of processing a substrate includes loading the substrate to which a processing liquid is adhered, inside a processing container, removing the processing liquid adhering to the substrate by supplying a first organic solvent to the loaded substrate, causing the substrate to be water-repellent by supplying a water repellent to the substrate from which the processing liquid has been removed, supplying a second organic solvent to the water-repellent substrate, and drying the substrate by volatilizing the second organic solvent adhering to the substrate.

12 Claims, 8 Drawing Sheets

SUBSTRATE PROCESSING APPARATUS AND METHOD OF PROCESSING SUBSTRATE

CROSS-REFERENCE TO RELATED APPLICATION

This application is based upon and claims the benefit of priority from Japanese Patent Application No. 2020-100983, filed on Jun. 10, 2020, the entire contents of which are incorporated herein by reference.

TECHNICAL FIELD

The present disclosure relates to a substrate processing apparatus and a method of processing a substrate.

BACKGROUND

A substrate processing apparatus disclosed in Patent Document 1 includes a liquid processing tank that collectively processes a plurality of substrates with a processing liquid, a dry processing tank that dries the liquid-processed substrates above the liquid processing tank, and a substrate transfer device that transfers the substrates between the liquid processing tank and the dry processing tank. The plurality of substrates are vertically arranged at intervals of each other, are immersed in the processing liquid such as a cleaning liquid or a rinsing liquid stored in the liquid processing tank, and then are transferred to the dry processing tank where a drying fluid such as IPA (isopropyl alcohol) steam is used to dry the substrates.

PRIOR ART DOCUMENTS

Patent Documents

Patent Document 1: Japanese laid-open publication No. 2014-103149

SUMMARY

According to one aspect of the present disclosure, a method of processing a substrate includes the following (A) to (E). (A) Loading the substrate to which a processing liquid is adhered, inside a processing container. (B) Removing the processing liquid adhering to the substrate by supplying a first organic solvent to the loaded substrate. (C) Causing the substrate to be water-repellent by supplying a water repellent to the substrate from which the processing liquid has been removed. (D) Supplying a second organic solvent to the water-repellent substrate. (E) Drying the substrate by volatilizing the second organic solvent adhering to the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
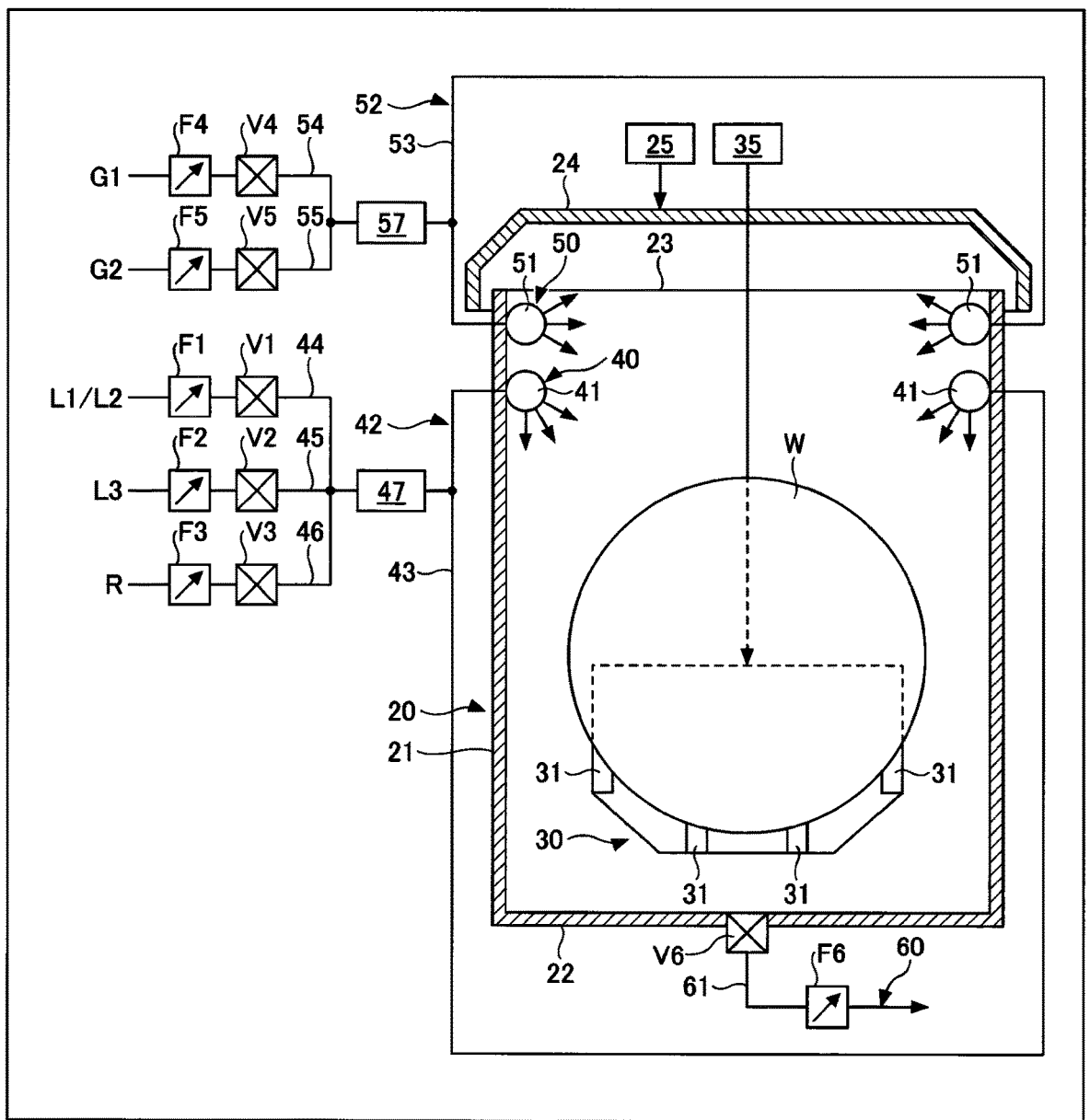
FIG. 1 is a view showing a substrate processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings. Throughout the drawings, the same or corresponding configurations are denoted by the same reference numerals, and explanation thereof may not be repeated.

First, a substrate processing apparatus 10 according to an embodiment will be described with reference to FIG. 1. A substrate W includes, for example, a semiconductor substrate such as a silicon wafer or a compound semiconductor wafer, or a glass substrate. A conductive film, an insulating film, or the like is formed on the surface of the semiconductor substrate or the glass substrate. A plurality of films may be formed. The substrate W includes a device such as an electronic circuit on its surface, and includes an uneven pattern (not shown).

A plurality of processing liquids are supplied in advance to the surface of the substrate W. For example, a chemical solution and a rinsing solution are supplied. The chemical solution is, for example, an acidic, alkaline or neutral aqueous solution. The rinsing solution is, for example, pure water. Conventionally, when the substrate W is dried, an uneven pattern on the surface of the substrate W may collapse due to the surface tension of water remaining on the surface of the substrate W.

Therefore, in order to suppress the collapse of the uneven pattern, a technique for causing the surface of the substrate W to be water-repellent is being examined. When an alkoxide-based silane coupling agent is used as the water repellent, the substrate W is dried due to an annealing process before the water-repellent effect is obtained.

In the present embodiment, a water repellent, for example, one having a Si—N bond, that obtains the water-repellent effect without drying the substrate W, is used. An example of the water repellent having a Si—N bond may include one represented by the following chemical formula (1).

[Chemical Formula 1]

In the above chemical formula (1), $R_1$, $R_2$, $R_3$, $R_4$, and $R_5$ are functional groups such as an alkyl group or a group in which at least some of hydrogen atoms of the alkyl group are substituted with fluorine atoms.

Specific examples of the above general formula (1) may include:
- (trimethylsilyl)dimethylamine (N,N-Dimethyltrimelysyllamine: TMSDMA)
- nonafluorohexyldimethyl(dimethylamino)silane (NFHDMA)
- dimethylaminotriethylsilane ((N,N-Dimethylamino)triethylsilane)
- butyldimethyl(dimethylamino)silane (Butyldimethyl(dimethylamino)silane
- octyldimethyl(dimethylamino)silane (n-Octyldimethyl(dimethylamino)silane)

Further, water repellents other than the one represented by the above chemical formula (1) may be used as the water repellent having the Si—N bond. For example, hexamethyldisilazane (1,1,1,3,3,3-Hexamethyldisilazane: HMDS) may be used.

Figure 2:
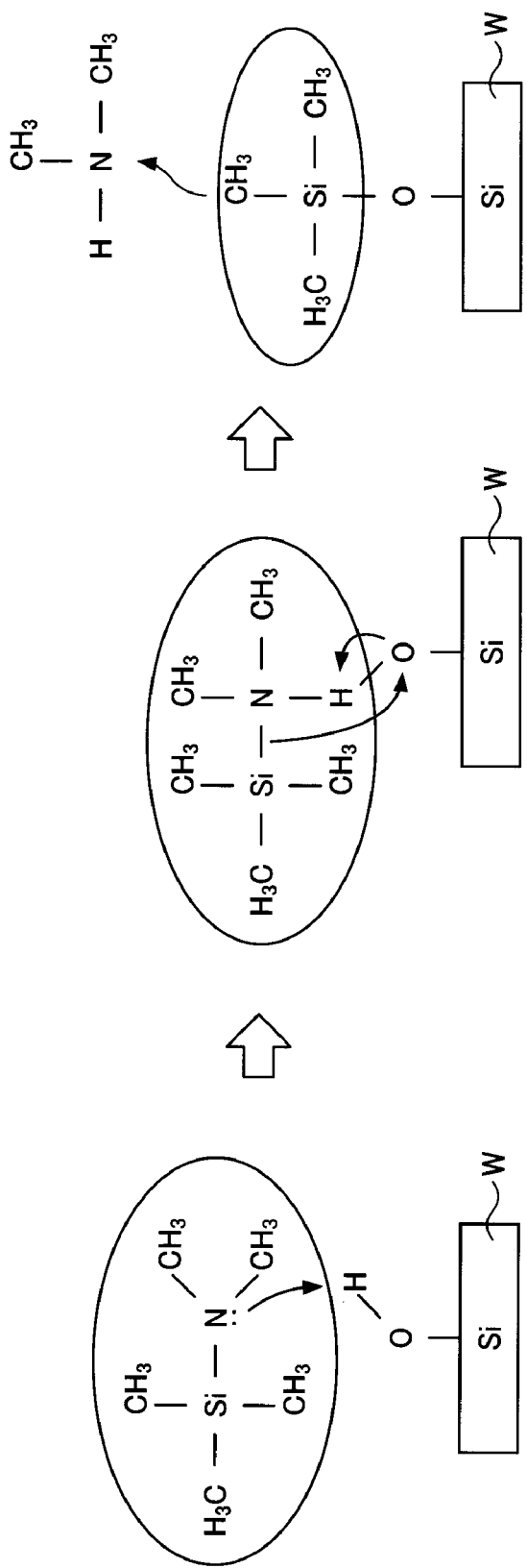
FIG. 2 is a view showing an example of reaction between TMSDMA, which is a water repellent, and a silanol group on a surface of a substrate.

As shown in FIG. 2, TMSDMA reacts with a silanol group (Si—OH group) on the surface of the substrate W to make the surface of the substrate W water-repellent. Since the reaction shown in FIG. 2 also occurs in the liquid, the water-repellent effect is obtained before the substrate W is dried. Even with a water repellent having the Si—N bond other than TMSDMA, a reaction similar to the reaction shown in FIG. 1 occurs.

Figure 3:
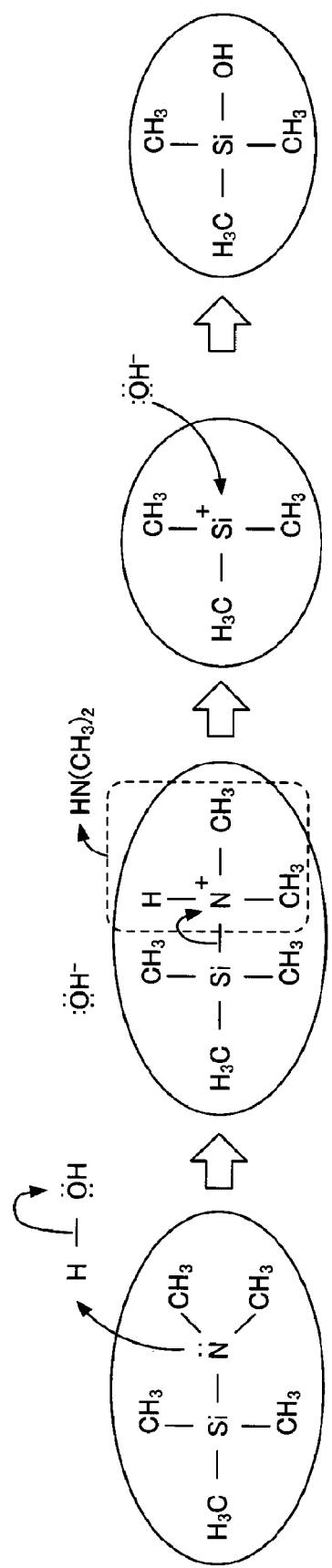
FIG. 3 is a view showing an example of reaction between TMSDMA, which is a water repellent, and water.

As shown in FIG. 3, TMSDMA also reacts with water to produce organic silanol. The organic silanol produces particles by a polymerization reaction. Even with a water repellent having the Si—N bond other than TMSDMA, a reaction similar to the reaction shown in FIG. 3 occurs.

Although details will be described later, in the present embodiment, after the substrate W to which water adheres is loaded into a processing container 20, and before the water repellent is supplied to the substrate W, a first organic solvent is supplied to the substrate W to remove the water adhering to the substrate W. Accordingly, it is possible to suppress generation of particles due to reaction between the water and the water repellent.

As shown in FIG. 1, the substrate processing apparatus 10 includes a processing container 20, a holder 30, a liquid supply 40, a gas supply 50, and a controller 90. The processing container 20 is a container into which the substrate W to which the processing liquid such as water is adhered is loaded. The holder 30 holds the substrate W inside the processing container 20. The liquid supply 40 supplies a liquid to the substrate W inside the processing container 20. The gas supply 50 supplies a gas to the inside of the processing container 20. The controller 90 controls the liquid supply 40 and the gas supply 50.

The processing container 20 has, for example, a tubular sidewall 21 and a bottom wall 22 that blocks the lower end of the sidewall 21. The tubular sidewall 21 is opened upward and has a loading/unloading port 23 for the substrate W at an upper end portion of the sidewall 21. The processing container 20 further has a lid 24 that opens/closes the loading/unloading port 23.

The lid 24 can be moved between a close position at which the loading/unloading port 23 is closed and an open position at which the loading/unloading port 23 is opened. The lid 24 opens the loading/unloading port 23 when the substrate W is loaded/unloaded, and closes the loading/unloading port 23 after the substrate W is loaded and before the substrate W is unloaded.

The substrate processing apparatus 10 further includes an opening/closing mechanism 25 that moves the lid 24 between the close position and the open position. The lid 24 can move automatically. The opening/closing mechanism 25 may move the lid 24 vertically or horizontally in parallel, or may rotate the lid 24.

The holder 30 receives the substrate W from a transfer device (not shown) and holds the substrate W from below. When the substrate processing apparatus 10 is of a batch type in which a plurality of substrates W are processed at once, the holder 30 holds the plurality of substrates W at the same time. For example, the holder 30 arranges the plurality of substrates W at intervals in a horizontal direction, and holds the plurality of substrates W vertically upright.

The holder 30 has, for example, a plurality of holding rods 31 parallel to each other. A plurality of grooves are formed in each of the plurality of holding rods 31 at intervals in a longitudinal direction thereof. The peripheral edges of the substrates W are inserted into the grooves. The plurality of substrates W are held at a plurality of points by the plurality of holding rods 31, respectively.

The substrate processing apparatus 10 of the present embodiment is of the batch type, but may be of a single-wafer type. The single-wafer type substrate processing apparatus 10 processes substrates one by one. When the substrate processing apparatus 10 is of the single-wafer type, the holder 30 holds the substrate W horizontally from below with an uneven pattern of the substrate W facing upward.

When the substrate processing apparatus 10 is of the batch type, the substrate processing apparatus 10 may further include an elevating mechanism 35 that raises and lowers the holder 30. The holder 30 receives the substrate W from a transfer device (not shown) above the processing container 20. At that time, a processing liquid such as water has adhered to the substrate W.

The substrate W is lowered together with the holder 30, passes through the loading/unloading port 23 of the processing container 20, and is loaded into the processing container 20. After the substrate W is dried inside the processing container 20, it is raised together with the holder 30 and is passed to the transfer device above the processing container 20.

The liquid supply 40 supplies a liquid to the substrate W held by the holder 30. The liquid to be supplied is, for example, a first organic solvent L1, a second organic solvent L2, a third organic solvent L3, and a water repellent R. In the present embodiment, the first organic solvent L1 and the second organic solvent L2 are IPA, the third organic solvent L3 is PGMEA (propylene glycol monomethyl ether acetate), and the water repellent R is MTSDMA. As will be described later, a combination of L1 to L3 and R is not particularly limited.

The liquid supply 40 includes one or more nozzles 41 that eject a liquid onto the substrate W held by the holder 30. The first organic solvent L1, the second organic solvent L2, the third organic solvent L3, and the water repellent R are ejected from the same nozzle 41 in the present embodiment, but may be ejected from different nozzles 41. The nozzles 41 eject the liquid in a form of mist or shower.

The nozzles 41 are arranged inside the processing container 20 above the substrate W. Inside the processing container 20, the substrates W are erected vertically and are arranged in a line at intervals in the horizontal direction. A plurality of nozzles 41 are arranged on both sides of the line of substrates W in a width direction (left-right direction in FIG. 1) at intervals in a longitudinal direction of the line of substrates W (direction orthogonal to a surface of this document in FIG. 1). The nozzles 41 eject a liquid toward gaps between adjacent substrates W.

The liquid supply 40 further includes a liquid supply mechanism 42 that supplies a liquid to the nozzles 41. The liquid supply mechanism 42 has a common line 43 and a plurality of individual lines 44 to 46. The common line 43 connects a confluence point of the plurality of individual lines 44 to 46 with the nozzles 41. A mixer 47 that mixes a plurality of types of liquids that are simultaneously supplied may be provided in the middle of the common line 43.

The individual line 44 supplies the first organic solvent L1 or the second organic solvent L2 to the nozzles 41. An opening/closing valve V1 and a flow rate controller F1 are provided in the middle of the individual line 44. When the opening/closing valve V1 opens a flow path of the individual line 44, the first organic solvent L1 or the second organic solvent L2 is supplied to the nozzles 41 via the common line 43 and is ejected from the nozzles 41. The flow rate thereof is controlled by the flow rate controller F1. On the other hand, when the opening/closing valve V1 closes the flow path of the individual line 44, the supply of the first organic solvent L1 or the second organic solvent L2 to the common line 43 is stopped.

The individual line 45 supplies the third organic solvent L3 to the nozzles 41. An opening/closing valve V2 and a flow rate controller F2 are provided in the middle of the individual line 45. When the opening/closing valve V2 opens a flow path of the individual line 45, the third organic solvent L3 is supplied to the nozzles 41 via the common line 43 and is ejected from the nozzles 41. The flow rate thereof is controlled by the flow rate controller F2. On the other hand, when the opening/closing valve V2 closes the flow path of the individual line 45, the supply of the third organic solvent L3 to the common line 43 is stopped.

The individual line 46 supplies the water repellent R to the nozzles 41. An opening/closing valve V3 and a flow rate controller F3 are provided in the middle of the individual line 46. When the opening/closing valve V3 opens a flow path of the individual line 46, the water repellent R is supplied to the nozzles 41 via the common line 43 and is ejected from the nozzles 41. The flow rate thereof is controlled by the flow rate controller F3. On the other hand, when the opening/closing valve V3 closes the flow path of the individual line 46, the supply of the water repellent R to the common line 43 is stopped.

The gas supply 50 supplies a gas to the inside of the processing container 20. The gas to be supplied is, for example, an inert gas G1 or a mixture of the inert gas G1 and the vapor G2 of the second organic solvent L2. The second organic solvent L2 is, for example, IPA. The gas to be supplied may be preheated. Drying of the substrate W can be promoted.

The gas supply 50 includes, for example, nozzles 51 that eject a gas. The nozzles 51 are arranged inside the processing container 20 above the substrate W. Inside the processing container 20, the substrates W are erected vertically and are arranged in a line at intervals in the horizontal direction. A plurality of nozzles 51 are arranged on both sides of the line of substrates W in the width direction at intervals in the longitudinal direction of the line of substrates W. The nozzles 51 are arranged above the nozzles 41 of the liquid supply 40.

The gas supply 50 further includes a gas supply mechanism 52 that supplies a liquid to the nozzles 51. The gas supply mechanism 52 has a common line 53 and a plurality of individual lines 54 and 55. The common line 53 connects a confluence point of the plurality of individual lines 54 and 55 with the nozzles 51. A heater 57 that heats the gas to be supplied may be provided in the middle of the common line 53.

The individual line 54 supplies the inert gas G1 to the nozzles 51. An opening/closing valve V4 and a flow rate controller F4 are provided in the middle of the individual line 54. When the opening/closing valve V4 opens a flow path of the individual line 54, the inert gas G1 is supplied to the nozzles 51 via the common line 53 and is ejected from the nozzles 51. The flow rate thereof is controlled by the flow rate controller F4. On the other hand, when the opening/closing valve V4 closes the flow path of the individual line 54, the supply of the inert gas G1 to the common line 53 is stopped.

The individual line 55 supplies the vapor G2 of the second organic solvent L2 to the nozzles 51. An opening/closing valve V5 and a flow rate controller F5 are provided in the middle of the individual line 55. When the opening/closing valve V5 opens a flow path of the individual line 55, the vapor G2 is supplied to the nozzles 51 via the common line 53 and is ejected from the nozzles 51. The flow rate thereof is controlled by the flow rate controller F5. On the other hand, when the opening/closing valve V5 closes the flow path of the individual line 55, the supply of the vapor G2 to the common line 53 is stopped.

The substrate processing apparatus 10 includes a discharger 60 that discharges a fluid from the inside of the processing container 20 to the outside thereof. The discharger 60 includes, for example, a discharge line 61 extending from the processing container 20. An opening/closing valve V6 and a flow rate controller F6 are provided in the middle of the discharge line 61.

When the opening/closing valve V6 opens a flow path of the discharge line 61, the fluid inside the processing container 20 is discharged. The flow rate thereof is controlled by the flow rate controller F6. On the other hand, when the opening/closing valve V6 closes the flow path of the discharge line 61, the discharge of the fluid is stopped.

The fluid discharged by the discharger 60 includes a liquid supplied by the liquid supply 40 and a gas supplied by the gas supply 50. A discharge line 61 for a liquid and a discharge line 61 for a gas may be provided separately.

The discharge line 61 is connected to, for example, the bottom wall 22 of the processing container 20. A downflow can be formed inside the processing container 20. The downflow can suppress droplets from flying up, thereby suppressing the droplets from adhering to the lower surface of the lid 24.

The controller 90 is, for example, a computer and includes a CPU (Central Processing Unit) 91 and a storage medium 92 such as a memory. The storage medium 92 stores programs that control various processes executed by the substrate processing apparatus 10. The controller 90 controls the operations of the substrate processing apparatus 10 by causing the CPU 91 to execute the programs stored in the storage medium 92.

Next, a substrate processing method according to an embodiment will be described with reference to FIG. 5. The substrate processing method includes, for example, steps S101 to S107 shown in FIG. 5. Step S101 to S107 are carried out under the control of the controller 90. It should be noted that all of steps S101 to S107 may not be carried out. For example, step S102 may not be carried out.

First, the holder 30 receives a substrate W to which a processing liquid such as water adheres, from a transfer device (not shown) above the processing container 20. Next, the elevating mechanism 35 lowers the substrate W together with the holder 30 and loads the substrate W into the processing container 20 (S101). Further, the opening/closing mechanism 25 moves the lid 24 from an open position to a close position, and closes the loading/unloading port 23 of the processing container 20 (S101). The inside of the processing container 20 contains air that has entered when the substrate W is loaded.

Next, the gas supply 50 supplies the inert gas G1 to the inside of the processing container 20 to purge the air contained in the processing container 20 (S102). The air is discharged to the outside of the processing container 20 by the discharger 60. Moisture contained in the air can be discharged, thereby suppressing reaction between the moisture and the water repellent R.

The supply of the inert gas G1 by the gas supply 50 and the discharge of the fluid by the discharger 60 are always carried out while the supply of the liquid to the substrate W and the dry of the substrate W are performed. A downflow can be formed inside the processing container 20, thereby suppressing droplets from flying up. The nozzles 51 of the gas supply 50 are arranged above the nozzles 41 of the liquid supply 40, thereby suppressing the droplets from flying up from the nozzles 41.

Next, the liquid supply 40 supplies the first organic solvent L1 to the substrate W (S103). The first organic solvent L1 removes water adhering to the substrate W. Although it may be water-soluble or water-insoluble, the first organic solvent L1 is preferably water-soluble, more preferably highly-water-soluble, in order to increase the substitution rate of water. If the first organic solvent L1 is water-soluble, water that has entered the concave portions of the uneven pattern of the substrate W can be efficiently replaced.

Water-insoluble means, for example, that the amount of dissolution in 100 g of water (the limit amount that can be dissolved in 100 g of water) is 0 g or more and less than 10 g. Hereinafter, the amount of dissolution in 100 g of water is also simply referred to as the "dissolved amount."

Water-soluble is classified into medium-water-soluble and highly-water-soluble depending on the amount of dissolution. The medium-water-soluble means, for example, that the amount of dissolution in 100 g of water is 10 g or more and 30 g or less. Specific examples of a medium-water-soluble organic solvent may include PGMEA, methyl acetate, and 2-butanone. The dissolution amount of PGMEA is 19.8 g, the dissolution amount of methyl acetate is 24.4 g, and the dissolution amount of 2-butanone is 27.5 g.

Highly-water-soluble means, for example, that the amount of dissolution in 100 g of water exceeds 30 g. In the case of highly-water solubility, the upper limit of the amount of dissolution in 100 g of water is not particularly limited. Specific examples of a highly-water-soluble organic solvent may include IPA and acetone.

The first organic solvent L1 is IPA in the present embodiment. The first organic solvent L1 is sprayed onto the substrate W in a form of mist or shower. The amount of the first organic solvent L1 used can be reduced as compared with a case where the substrate W is immersed in the first organic solvent L1 stored in the processing container 20.

Inside the processing container 20, the substrates W are erected vertically and are arranged in a line at intervals in the horizontal direction. The nozzles 41 eject the first organic solvent L1 toward gaps between the substrates W. At that time, the elevating mechanism 35 may raise and lower the substrate W together with the holder 30. The substrate W and the nozzles 41 are relatively raised and lowered so that the first organic solvent L1 can be efficiently supplied over the entire of the substrate W in the vertical direction. Instead of raising and lowering the substrate W, the nozzles 41 may be raised and lowered.

Next, the liquid supply 40 supplies the water repellent R to the substrate W (S104). As the water repellent R, for example, one having a Si—N bond is used. The substrate W can be made water-repellent without drying the substrate W. The water repellent R is TMSDMA in the present embodiment. The water repellent R is sprayed onto the substrate W in a form of mist or shower. The amount of the water repellent R used can be reduced as compared with a case where the substrate W is immersed in the water repellent R stored in the processing container 20.

Inside the processing container 20, the substrates W are erected vertically and are arranged in a line at intervals in the horizontal direction. The nozzles 41 eject the water repellent R toward the gaps between the substrates W. At that time, the elevating mechanism 35 may raise and lower the substrate W together with the holder 30. The substrate W and the nozzles 41 are relatively raised and lowered so that the water repellent R can be efficiently supplied over the entire of the substrate W in the vertical direction. Instead of raising and lowering the substrate W, the nozzles 41 may be raised and lowered.

When the water repellent R is supplied, a mixture of the water repellent R and the first organic solvent L1 may be supplied. The amount of water repellent R used can be reduced. The content of the water repellent R in the mixture of the water repellent R and the first organic solvent L1 is, for example, 2 mass % or more and 50 mass % or less, specifically 2 mass % or more and 20 mass % or less, more specifically 2 mass % or more and 10 mass % or less.

Next, the liquid supply 40 supplies the second organic solvent L2 to the substrate W (S105). Supplying the second organic solvent L2 to the substrate W includes removing an unreacted water repellent R from the substrate W. The supply of the water repellent R is stopped. The second organic solvent L2 is IPA in the present embodiment, but is not particularly limited as long as it can dissolve the unreacted water repellent R and has high volatility.

Next, the gas supply 50 supplies the inert gas G1 to the inside of the processing container 20, and the discharger 60 discharges a gas inside the processing container to volatilize the second organic solvent L2 adhering to the substrate W so that the substrate W is dried (S106). The inert gas G1 may be preheated to promote the drying. When the substrate W is dried, the liquid supply 40 stops the supply of the liquid to the substrate W.

When the inert gas G1 is supplied, a mixture of the inert gas G1 and the vapor G2 of the second organic solvent L2 may be supplied. The vapor G2 of the second organic solvent L2 condenses when it adheres to the substrate W. The substrate W can be heated by the heat of condensation so that the drying of the substrate W can be promoted.

Next, the opening/closing mechanism 25 moves the lid 24 from the close position to the open position to open the loading/unloading port 23 of the processing container 20 (S107). Further, the elevating mechanism 35 raises the substrate W together with the holder 30 to unload the substrate W out of the processing container 20 (S107). After that, the holder 30 passes the substrate W to a transfer device (not shown) above the processing container 20.

By the way, when alcohols are used as the first organic solvent L1 or the second organic solvent L2, since the alcohols have an OH group like water, the second organic solvent L2 reacts with the water repellent R.

Figure 4:
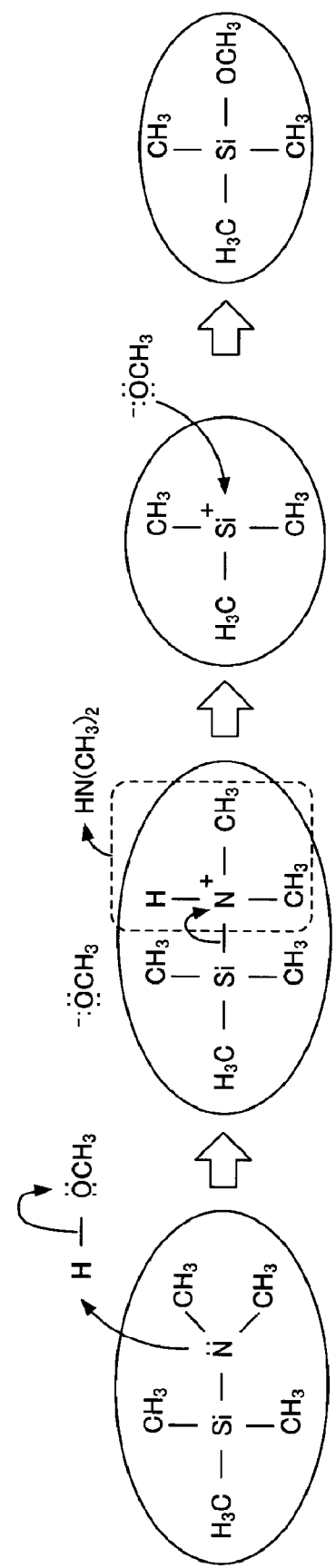
FIG. 4 is a view showing an example of reaction between TMSDMA, which is a water repellent, and methanol.

For example, as shown in FIG. 4, a Si—$OCH_3$ bond is formed by reaction between TMSDMA and methanol. Unlike a Si—OH bond shown in FIG. 3, the Si—$OCH_3$ bond does not cause a polymerization reaction in an environment where no water exists.

Therefore, the alcohols have the OH group like water, but unlike water, they do not generate particles.

Therefore, the alcohols can be used as the first organic solvent L1 or the second organic solvent L2. However, the first organic solvent L1 or the second organic solvent L2 may contain a small amount of water. As a result, minute particles may be generated.

In recent years, since the uneven pattern of the substrate W has been miniaturized, it is conceivable that even minute particles may cause a problem.

If a problem occurs even with minute particles, the third organic solvent L3 containing no OH group is also used, which will be described in detail later. The third organic solvent L3 is, for example, ketones, esters, ethers, or the like.

The third organic solvent L3 may be water-soluble, as described above. Specific examples of the third organic solvent L3 may include acetone, PGMEA, methyl acetate, 2-butanone, and the like. Among these, acetone is particularly preferable from the viewpoint of high water solubility.

Next, a substrate processing method according to a modification will be described with reference to FIG. 6. The substrate processing method of this modification includes steps S101 to S107 and S111 to S112. Steps S101 to S107, S111, and S112 are carried out under the control of the controller 90. In steps S111 and S112, the third organic solvent L3 is supplied to the substrate W. It should be noted that all of steps S101 to S107, S111, and S112 may not be carried out. For example, step S112 may not be carried out. Hereinafter, differences between the present modification and the above-described embodiment will be mainly described.

Figure 6:
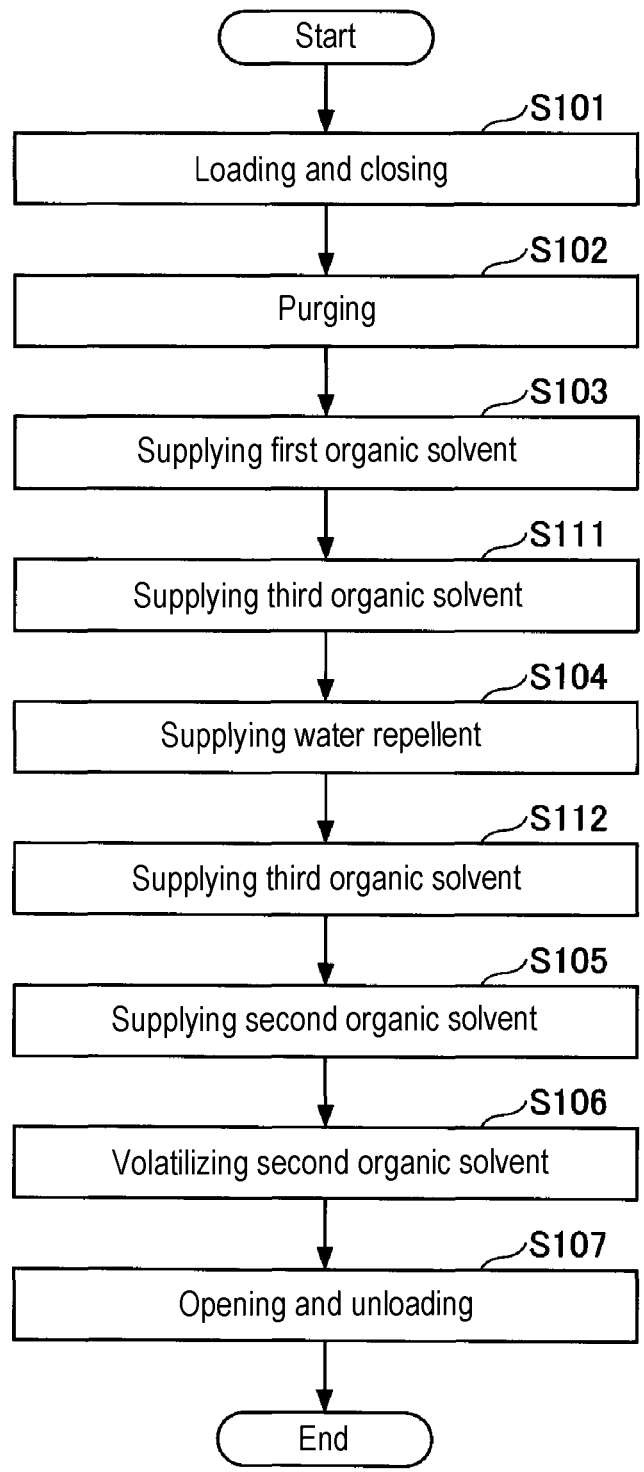
FIG. 6 is a flow chart showing a substrate processing method according to a modification.

Step S111 is carried out after step S103 and before step S104, as shown in FIG. 6. In step S103, the liquid supply 40 supplies the first organic solvent L1 to the substrate W. On the other hand, in step S104, the liquid supply 40 supplies the water repellent R to the substrate W.

In step S111, the liquid supply 40 supplies the third organic solvent L3 different from the first organic solvent L1 to the substrate W to remove the first organic solvent L1 adhering to the substrate W. The first organic solvent L1 has an OH group, whereas the third organic solvent L3 has no OH group.

Since the first organic solvent L1 has the OH group which is a hydrophilic group, water adhering to the substrate W can be efficiently removed in step S103. On the other hand, since the third organic solvent L3 has no OH group, it does not react with the water repellent R. Therefore, in step S104, it is possible to suppress generation of minute particles.

In step S104, the liquid supply 40 supplies the water repellent R to the substrate W. When the water repellent R is supplied, a mixture of the water repellent R and the third organic solvent L3 may be supplied. The amount of water repellent R used can be reduced. The content of the water repellent R in the mixture of the water repellent R and the third organic solvent L3 is, for example, 2 mass % or more and 50 mass % or less, specifically 2 mass % or more and 20 mass % or less, more specifically 2 mass % or more and 10 mass % or less.

Step S112 is carried out after step S104 and before step S105, as shown in FIG. 6. In step S105, the liquid supply 40 supplies the second organic solvent L2 to the substrate W. The second organic solvent L2 has an OH group like the first organic solvent L1.

In step S112, the liquid supply 40 supplies the third organic solvent L3 to the substrate W to remove an unreacted water repellent R from the substrate W. As a result, in step S105, reaction between the second organic solvent L2 having the OH group and the water repellent R can be suppressed, and generation of minute particles can also be suppressed.

In step S105, the liquid supply 40 supplies the second organic solvent L2 to the substrate W to replace the third organic solvent L3 adhering to the substrate W with the second organic solvent L2. The second organic solvent L2 has a lower boiling point than the third organic solvent L3 and has high volatility. As a result, in step S106, the drying of the substrate W can be promoted.

Figure 7:
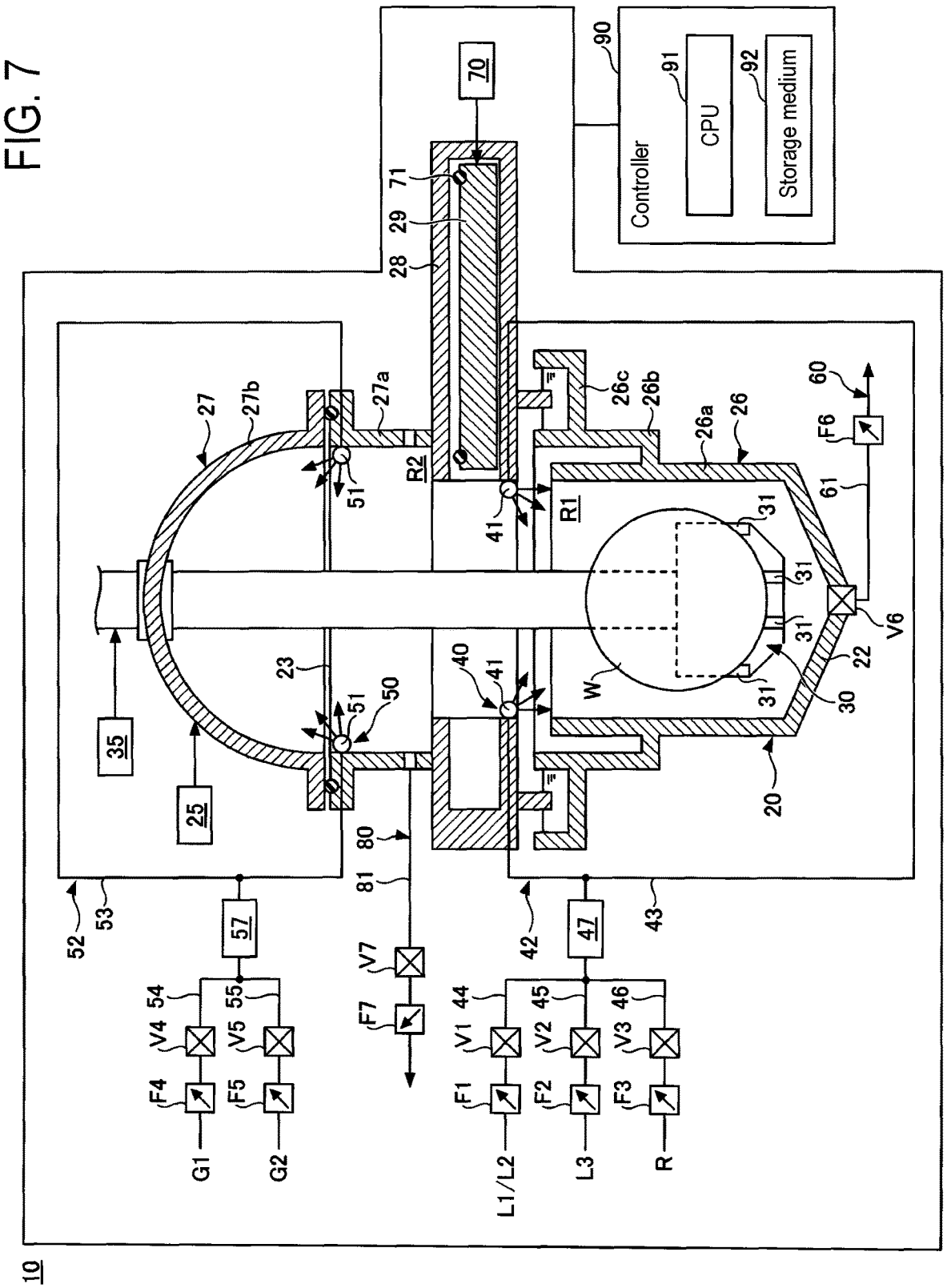
FIG. 7 is a view showing a state at the time of liquid processing of the substrate processing apparatus according to the modification.
Figure 8:
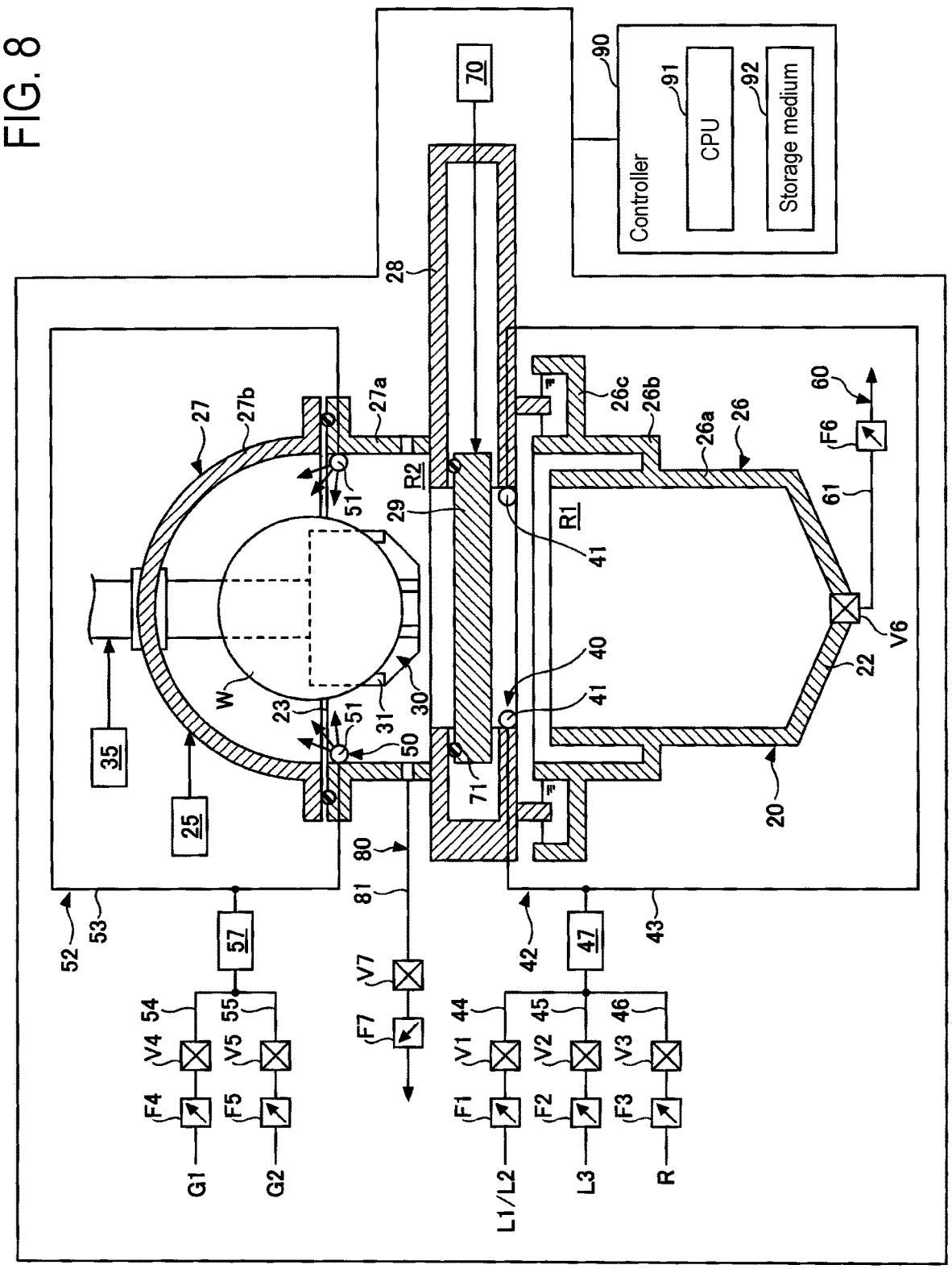
FIG. 8 is a view showing a state at the time of drying of the substrate processing apparatus according to the modification.

Next, a substrate processing apparatus 10 according to a modification will be described with reference to FIGS. 7 and 8. Hereinafter, differences between the substrate processing apparatus 10 of this modification and the substrate processing apparatus 10 of the above embodiment will be described.

The processing container 20 has a liquid processing tank 26 that internally forms a liquid processing chamber R1 in which a liquid is supplied to the substrate W. The nozzles 41 of the liquid supply 40 are arranged in the liquid processing chamber R1. The liquid processing tank 26 has, for example, an inner tank 26a forming the liquid processing chamber R1 inside, an outer tank 26b surrounding an upper end portion of the inner tank 26a, and a seal tank 26c surrounding an upper end portion of the outer tank 26b. A discharge line 61 is connected to a bottom wall 22 of the inner tank 26a. The seal tank 26c is filled with pure water or the like to suppress the intrusion of outside air.

Further, the processing container 20 has a drying tank 27 that internally forms a drying chamber R2 in which the substrate W is dried. The nozzles 51 of the gas supply 50 are arranged in the drying chamber R2. The drying tank 27 is disposed above the liquid processing tank 26. The drying tank 27 includes, for example, a tubular sidewall 27a. The tubular sidewall 27a is opened upward and has a loading/unloading port 23 for the substrate W at an upper end portion of the sidewall 27a. The drying tank 27 further has a lid 27b that opens/closes the loading/unloading port 23. The lid 27b has an upwardly-convex dome shape and is moved up and down by the opening/closing mechanism 25.

Further, the processing container 20 has a casing 28 between the liquid processing tank 26 and the drying tank 27. A shutter 29 is movably disposed inside the casing 28. The shutter 29 is moved between a communication position (see FIG. 7) that communicates the liquid processing chamber R1 and the drying chamber R2 and a shutoff position (see FIG. 8) that shuts off the liquid processing chamber R1 and the drying chamber R2.

The substrate processing apparatus 10 further includes an opening/closing mechanism 70 that moves the shutter 29 between the communication position and the shutoff position. The opening/closing mechanism 70 moves the shutter 29 horizontally. The opening/closing mechanism 70 may further move the shutter 29 vertically. The shutter 29 is disposed horizontally and holds a frame-shaped seal 71 on its upper surface.

The substrate processing apparatus 10 includes a second discharger 80 that discharges a gas from the inside of the drying tank 27 to the outside thereof. The second discharger 80 includes, for example, a second discharge line 81 extending from the drying tank 27. An opening/closing valve V7 and a flow rate controller F7 are provided in the middle of the second discharge line 81.

When the opening/closing valve V7 opens a flow path of the second discharge line 81, a gas inside the drying tank 27 is discharged. A flow rate thereof is controlled by the flow rate controller F7. On the other hand, when the opening/closing valve V7 closes the flow path of the second discharge line 81, the discharge of the gas is stopped.

The second discharge line 81 is connected to, for example, a lower portion of the sidewall 27a of the drying tank 27. A downflow can be formed inside the drying tank 27. It is possible to suppress droplets from flying up due to the downflow, thereby suppressing the droplets from adhering to the lower surface of the lid 24.

Figure 5:
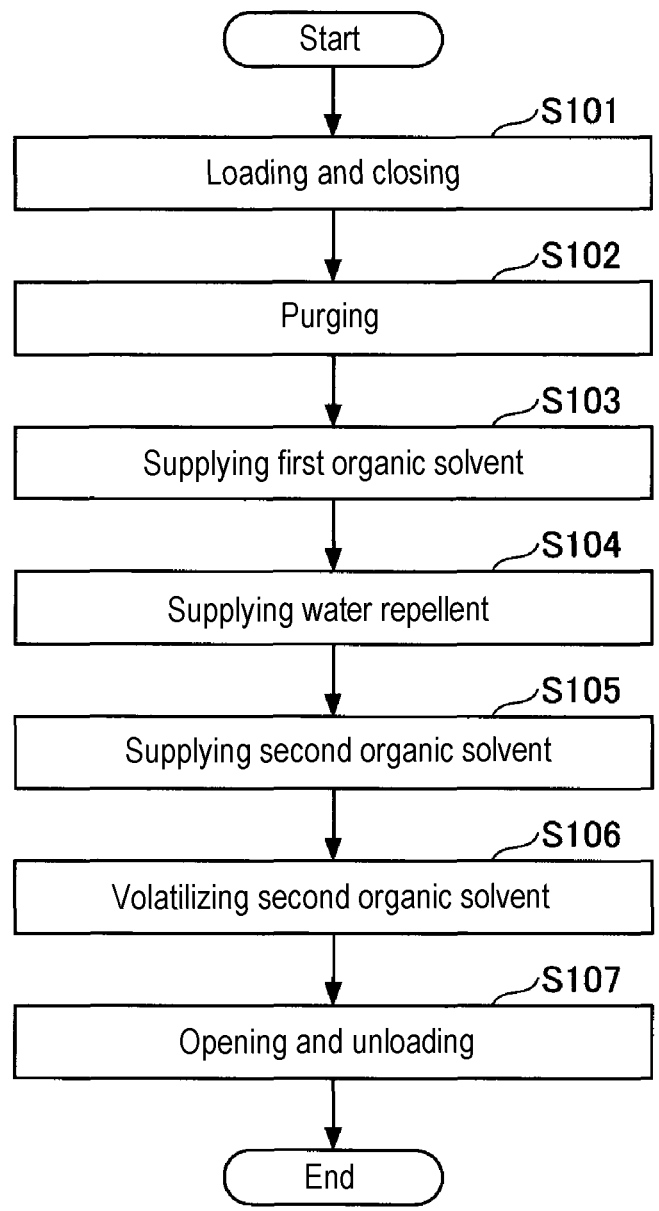
FIG. 5 is a flow chart showing a substrate processing method according to an embodiment.

The substrate processing apparatus 10 of this modification carries out, for example, the substrate processing method shown in FIG. 5 or 6.

In step S101, the elevating mechanism 35 lowers the substrate W together with the holder 30 and loads the substrate W into the processing container 20. The substrate W passes through the drying chamber R2 and is loaded up to the liquid processing chamber R1. At that time, the shutter 29 is located at the communication position so as not to interfere with the substrate W. In step S101, the opening/closing mechanism 25 moves the lid 27b from the open position to the close position to close the loading/unloading port 23 of the processing container 20.

In step S102, the gas supply 50 supplies the inert gas G1 to the inside of the processing container 20 to purge the air contained in the processing container 20. The air is discharged to the outside of the processing container 20 by the discharger 60. In step S102, the discharger 60 may be operated, and the second discharger 80 may or may not be operated.

The supply of the inert gas G1 by the gas supply 50 and the discharge of the fluid by the discharger 60 are always carried out at least while the supply of the liquid to the substrate W is performed in the liquid processing chamber R1. A downflow can be formed inside the processing container 20, thereby suppressing droplets from flying up.

In step S103, the liquid supply 40 supplies the first organic solvent L1 to the substrate W. The first organic solvent L1 removes water adhering to the substrate W. Step S111 may be performed after step S103 and before step S104.

In step S104, the liquid supply 40 supplies the water repellent R to the substrate W. Step S112 may be performed after step S104 and before step S105.

In step S105, the liquid supply 40 supplies the second organic solvent L2 to the substrate W. After step S105 and before step S106, the elevating mechanism 35 raises the substrate W together with the holder 30. The substrate W is moved from the liquid processing chamber R1 to the drying chamber R2. Subsequently, the opening/closing mechanism 70 moves the shutter 29 from the communication position to the shutoff position. In step S106, the drying of the substrate W can be promoted.

In step S106, the gas supply 50 supplies the inert gas G1 to the drying chamber R2, and the second discharger 80 discharges the gas from the drying chamber R2 to the outside, so that the second organic solvent L2 adhering to the substrate W Is volatilized to dry the substrate W. The inert gas G1 may be preheated to promote the drying. When the substrate W is dried, the liquid supply 40 stops the supply of the liquid to the substrate W.

When the inert gas G1 is supplied, a mixture of the inert gas G1 and the vapor G2 of the second organic solvent L2 may be supplied. The vapor G2 of the second organic solvent L2 condenses when it adheres to the substrate W. The substrate W can be heated by the heat of condensation so that the drying of the substrate W can be promoted.

In step S107, the opening/closing mechanism 25 moves the lid 27b from the close position to the open position to open the loading/unloading port 23 of the processing container 20. Further, in step S107, the elevating mechanism 35 raises the substrate W together with the holder 30 and unloads the substrate W out of the processing container 20. After that, the holder 30 passes the substrate W to a transfer device (not shown) above the processing container 20.

Although the embodiments of the substrate processing method and the substrate processing apparatus according to the present disclosure have been described above, the present disclosure is not limited to the above embodiments, and the like. Various changes, alterations, replacements, additions, deletions, and combinations are possible without depart from the scope and spirit set forth in the claims. Of course, they also belong to the technical scope of the present disclosure.

According to the present disclosure in some embodiments, it is possible to make a substrate to be water-repellent with a water repellent to suppress collapse of an uneven pattern of the substrate and further suppress generation of particles due to the water repellent.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in a form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   loading the substrate to which a processing liquid is adhered, inside a processing container;
   removing the processing liquid adhering to the substrate by supplying a first organic solvent to the loaded substrate;
   subsequently, removing the first organic solvent adhering to the substrate by supplying a third organic solvent different from the first organic solvent to the substrate;
   subsequently, causing the substrate to be water-repellent by supplying a water repellent to the substrate from which the processing liquid has been removed;
   subsequently, removing an unreacted water repellent from the substrate by supplying the third organic solvent to the substrate;
   subsequently, supplying a second organic solvent to the water-repellent substrate; and
   drying the substrate by volatilizing the second organic solvent adhering to the substrate,
   wherein the first organic solvent has an OH group and the third organic solvent does not have the OH group, and
   wherein the second organic solvent has an OH group.

2. The method of claim 1, wherein when the water repellent is supplied to the substrate, a mixture of the water repellent and the first organic solvent is supplied to the substrate.

3. The method of claim 2, wherein supplying the second organic solvent to the substrate includes removing an unreacted water repellent from the substrate.

4. The method of claim 2, wherein the first organic solvent and the second organic solvent are isopropyl alcohol (IPA).

5. The method of claim 1, wherein supplying the second organic solvent to the substrate includes removing an unreacted water repellent from the substrate.

6. The method of claim 5, wherein the first organic solvent and the second organic solvent are isopropyl alcohol (IPA).

7. The method of claim 1, wherein when the water repellent is supplied to the substrate, a mixture of the water repellent and the third organic solvent is supplied to the substrate.

8. The method of claim 1, wherein supplying the second organic solvent to the substrate includes replacing the third organic solvent adhering to the substrate with the second organic solvent, and
wherein the second organic solvent has a lower boiling point than the third organic solvent.

9. The method of claim 1, wherein the first organic solvent and the second organic solvent are isopropyl alcohol (IPA), and
wherein the third organic solvent is propylene glycol monomethyl ether acetate (PGMEA).

10. The method of claim 1, wherein the first organic solvent, the second organic solvent, and the water repellent are sprayed onto the substrate in a form of mist or shower.

11. The method of claim 1, wherein the water repellent has a Si—N bond.

12. The method of claim 1, wherein the processing liquid contains water.

* * * * *